(12) United States Patent
Ma et al.

(10) Patent No.: US 10,943,897 B2
(45) Date of Patent: Mar. 9, 2021

(54) METHOD OF FORMING THREE-DIMENSIONAL INTEGRATED CIRCUIT HAVING ESD PROTECTION CIRCUIT

(71) Applicant: TAIWAN SEMICONDUCTOR MANUFACTURING COMPANY, LTD., Hsinchu (TW)

(72) Inventors: Wei Yu Ma, Taitung (TW); Chia-Hui Chen, Hsinchu (TW); Kuo-Ji Chen, Taipei County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/050,694

(22) Filed: Jul. 31, 2018

(65) Prior Publication Data

US 2018/0337169 A1 Nov. 22, 2018

Related U.S. Application Data

(62) Division of application No. 14/168,151, filed on Jan. 30, 2014.

(51) Int. Cl.
*H01L 23/60* (2006.01)
*H01L 27/02* (2006.01)
*H01L 27/06* (2006.01)
*H01L 29/861* (2006.01)
*H01L 23/48* (2006.01)

(52) U.S. Cl.
CPC .......... *H01L 27/0255* (2013.01); *H01L 23/60* (2013.01); *H01L 27/0296* (2013.01); *H01L 27/0688* (2013.01); *H01L 23/481* (2013.01); *H01L 29/8611* (2013.01); *H01L 2924/0002* (2013.01)

(58) Field of Classification Search
CPC ...................................................... H01L 23/60
USPC ........................................................ 438/109
See application file for complete search history.

(56) References Cited

U.S. PATENT DOCUMENTS

2005/0201031 A1   9/2005   Furuta
2010/0039740 A1   2/2010   Jalilizeinali et al.

*Primary Examiner* — Hsin Yi Hsieh
(74) *Attorney, Agent, or Firm* — Hauptman Ham, LLP

(57) ABSTRACT

A method (of forming an integrated circuit) includes: forming a first diode on a first substrate of two or more stacked substrates, the first substrate having a first predetermined doping type; forming a second diode on a second substrate of the two or more stacked substrates, the second substrate being formed on the first substrate, and the second substrate having the first predetermined doping type; and forming conductive paths electrically connecting the first diode 3A and the second diode between a circuit and a first common ground rail, the first diode and the second diode being connected in parallel and having opposite polarities.

20 Claims, 4 Drawing Sheets

METHOD OF FORMING THREE-DIMENSIONAL INTEGRATED CIRCUIT HAVING ESD PROTECTION CIRCUIT

PRIORITY CLAIM

The present application is a divisional of U.S. application Ser. No. 14/168,151, filed Jan. 30, 2014, which is incorporated herein by reference in its entirety.

BACKGROUND

Device manufacturers are continually challenged to deliver value and convenience to consumers by, for example, providing integrated circuits that perform at optimal levels while occupying minimal space. Three-dimensional integrated circuits (3D ICs), such as through-substrate-via (TSV) based 3D ICs or inter-layer-via (ILV) based 3D ICs, increase processing capabilities while reducing an overall footprint of the integrated circuit compared to a two-dimensional integrated circuit having similar processing capabilities. In some applications, various electrostatic discharge (ESD) protection circuits are implemented in a 3D IC to protect the electrical components and circuits on the 3D IC from ESD damage.

DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

Figure 1:
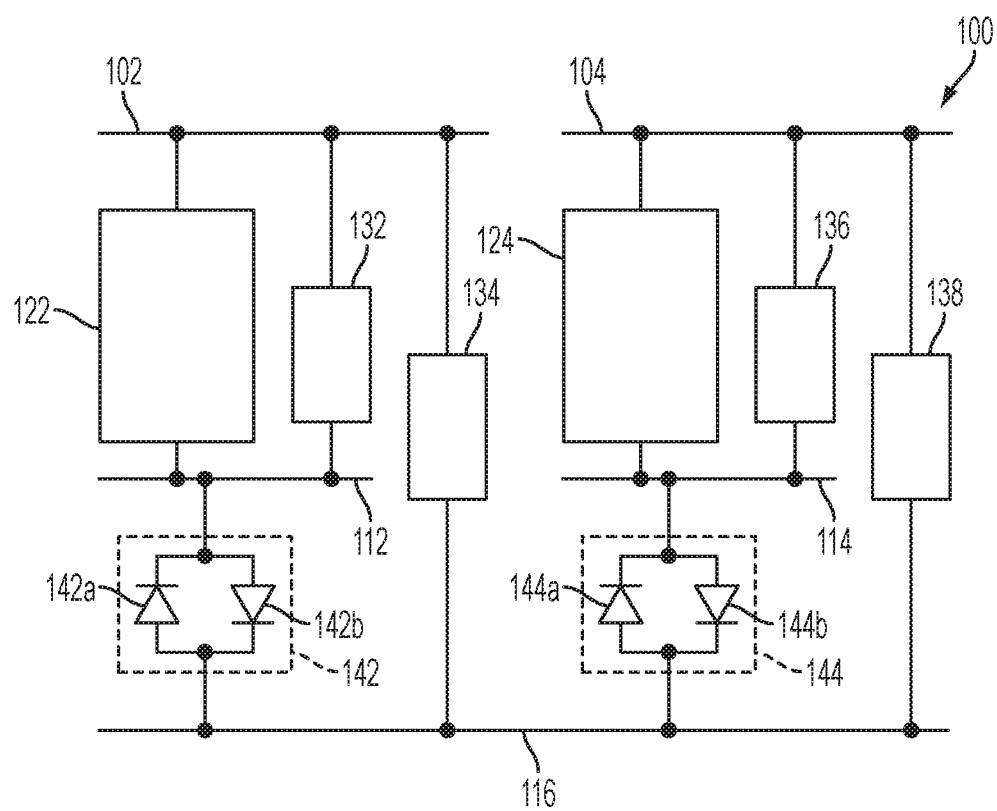
FIG. 1 is a block diagram of a portion of an integrated circuit in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one feature relationship to another feature. The spatially relative terms are intended to cover different orientations of the device including the features.

FIG. 1 is a block diagram of a portion of an integrated circuit 100 in accordance with one or more embodiments. Integrated circuit 100 includes a first supply power rail 102, a second supply power rail 104, a first ground reference rail 112, a second ground reference rail 114, and a common ground reference rail 116. Integrated circuit 100 further includes a first circuit 122 electrically coupled between the first supply power rail 102 and the first ground reference rail 112 and a second circuit 124 electrically coupled between the second supply power rail 104 and the second ground reference rail 114.

In some embodiments, first supply power rail 102 and second supply power rail 104 are coupled to the same or two different power sources. In some embodiments, common ground reference rail 116 is coupled to a reference power source having a voltage level lower than those of supply power rails 102 and 104 or ground. In some embodiments, first supply power rail 102 and first ground reference rail 112 define a first power domain for operating first circuit 122, and second supply power rail 104 and second ground reference rail 114 define a second power domain for operating second circuit 124.

Furthermore, to protect first circuit 122 and second circuit 124 from ESD damage, integrated circuit 100 further includes various ESD protection circuits, such as ESD clamp circuits 132, 134, 136, and 138 and ESD conduction circuits 142 and 144. In some embodiments, one or more of ESD clamp circuits 132, 134, 136, and 138 and ESD conduction circuits 142 and 144 are omitted. In some embodiments, additional ESD protection circuits are implemented to protect first circuit 122 and second circuit 124.

ESD clamp circuit 132 is electrically coupled between first supply power rail 102 and first ground reference rail 112 and configured to provide a conductive path between first supply power rail 102 and first ground reference rail 112 when an ESD event occurs on first supply power rail 102. ESD clamp circuit 134 is electrically coupled between first supply power rail 102 and common ground reference rail 116 and configured to provide a conductive path between first supply power rail 102 and common ground reference rail 116 when an ESD event occurs on first supply power rail 102. ESD clamp circuit 136 is electrically coupled between second supply power rail 104 and second ground reference rail 114 and configured to provide a conductive path between second supply power rail 104 and second ground reference rail 114 when an ESD event occurs on second supply power rail 104. ESD clamp circuit 138 is electrically coupled between second supply power rail 104 and common ground reference rail 116 and configured to provide a conductive path between second supply power rail 104 and common ground reference rail 116 when an ESD event occurs on second supply power rail 104.

ESD conduction circuit 142 is coupled between first ground reference rail 112 and common ground reference rail 116. ESD conduction circuit 142 includes two diodes 142a and 142b, which are connected in parallel and have opposite polarities. In other words, cathode of diode 142a is coupled with anode of diode 142b and first ground reference rail 112, and anode of diode 142a is coupled with cathode of diode 142b and common ground reference rail 116. ESD conduction circuit 142 is configured to isolate or to attenuate transmission of noise between first ground reference rail 112 and common ground reference rail 116 when the diodes 142a and 142b are both not turned on. ESD conduction circuit 144 is coupled between second ground reference rail 114 and common ground reference rail 116. ESD conduction circuit 144 includes two diodes 144a and 144b, which are also connected in parallel and have opposite polarities. ESD conduction circuit 144 is configured to isolate or to attenuate transmission of noise between second ground reference rail 114 and common ground reference rail 116 when the diodes 144a and 144b are not fully turned on.

There are two circuits 122 and 124 and corresponding power rails and ground reference rails and ESD protection circuits depicted in FIG. 1. In some embodiments, there are more or less than two circuits and corresponding power rails, ground reference rails, or ESD protection circuits implemented in integrated circuit 100.

Figure 2A:
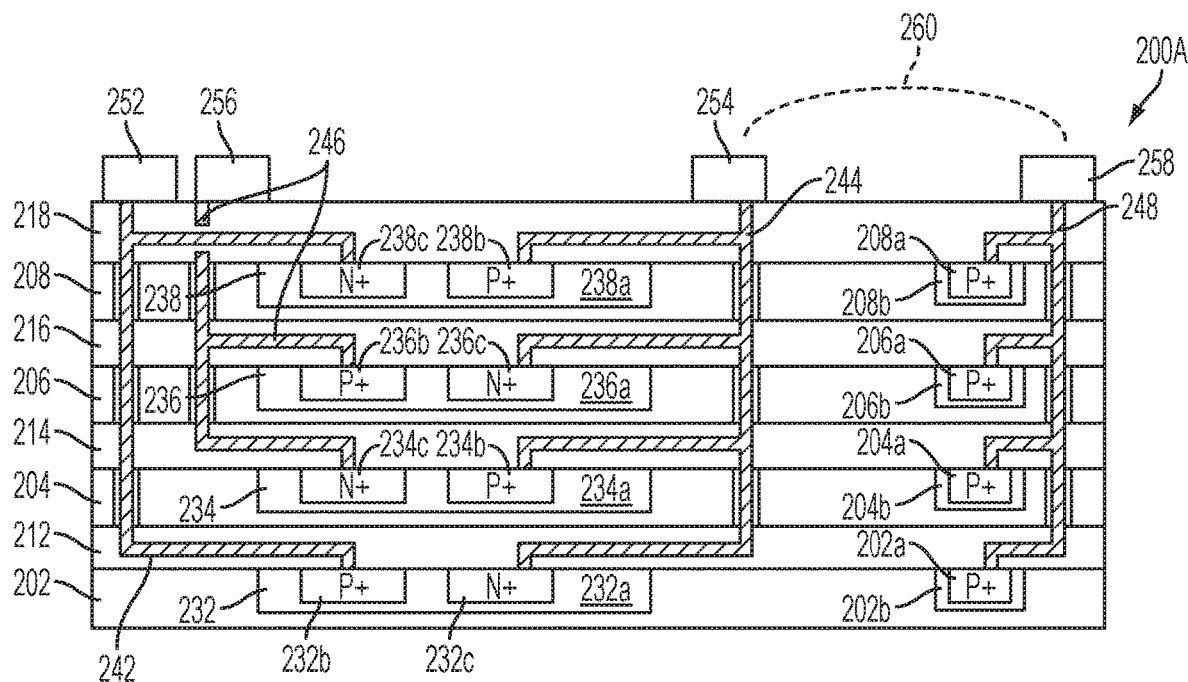
FIGS. 2A-2B are cross-sectional views of a portion of example integrated circuits in accordance with one or more embodiments.

FIG. 2A is a cross-sectional view of a portion of an example integrated circuit 200A in accordance with one or more embodiments. In some embodiments, integrated circuit 200A is manufactured based on a block diagram similar to the one depicted in FIG. 1. Integrated circuit 200A includes two or more substrates stacked one over another, including a first substrate 202, a second substrate 204 over first substrate 202, a third substrate 206 over second substrate 204, and a fourth substrate 208 over third substrate 206. The substrates 202-208 have a P-type doping, and are referred to as P-type substrates in this disclosure. Each of the substrates 202-208 has a corresponding heavily doped P-type region 202a, 204a, 206a, or 208a surrounded by a corresponding P-type well region 202b, 204b, 206b, or 208b. Each of the substrates 202-208 is capable of being biased through corresponding region 202a, 204a, 206a, or 208a and corresponding well region 202b, 204b, 206b, or 208b.

Each of the substrates 202-208 has a corresponding interconnection structure 212, 214, 216, and 218. In some embodiments, each of the interconnection structure 212, 214, 216, and 218 has one or more layers of conductive lines or conductive via plugs embedded in one or more layers of dielectric materials. In some embodiments, a set of electrical components are formed on one or more of the substrates 202-208. In some embodiments, the set of electrical components is connected by one or more of the interconnection structures 212-218 and is configured to form a first circuit, such as first circuit 122 in FIG. 1. The first circuit has a first internal ground node. In some embodiments, another set of electrical components are also formed on one or more of the substrates 202-208. In some embodiments, the another set of electrical components is connected by one or more of the interconnection structures 212-218 and is configured to form a second circuit, such as second circuit 124 in FIG. 1. The second circuit has a second internal ground node.

Each of the substrates 202-208 has a corresponding diode 232, 234, 236, or 238 formed thereon. Diode 232 includes a P-type well 232a, a P-type anode region 232b, and an N-type cathode region 232c. Diode 232 is also known as an N-type diode, because diode 232 has a structure that the cathode or N-type region is surrounded by the anode or P-type region of the diode. Diode 238 includes a P-type well 238a, a P-type anode region 238b, and an N-type cathode region 238c, and is also an N-type diode.

In some embodiments, diodes 232 and 238 have structures other than the example depicted in FIG. 2A.

Anode 232b of diode 232 is electrically connected to cathode 238c of diode 238 through a conductive structure 242, and cathode 232c of diode 232 is electrically connected to anode 238b of diode 238 through a conductive structure 244. Conductive structure 242 is usable as first ground reference rail 112 in FIG. 1 and is electrically connected to first ground node of first circuit 122. Conductive structure 244 is usable as a part of common ground reference rail 116 in FIG. 1. Thus, diode 232 and diode 238 are electrically connected in parallel and have opposite polarities between conductive structure 242 (as the first ground reference rail 112) and conductive structure 244 (as a part of the common ground reference rail 116). Thus, in FIG. 2A, ESD conduction circuit 142 is implemented by two diodes that are both N-type diodes.

Diode 234 includes an N-type well 234a, a P-type anode region 234b, and an N-type cathode region 234c. Diode 234 is also referred to as a P-type diode, because diode 234 has a structure that the anode or P-type region is surrounded by the cathode or N-type region of the diode. Diode 236 includes an N-type well 236a, a P-type anode region 236b, and an N-type cathode region 236c, and is also a P-type diode.

In some embodiments, diodes 234 and 236 have structures other than the example depicted in FIG. 2A.

Anode 234b of diode 234 is electrically connected to cathode 236c of diode 236 through conductive structure 244, and cathode 234c of diode 234 is electrically connected to anode 236b of diode 236 through a conductive structure 246. Conductive structure 246 is usable as second ground reference rail 114 in FIG. 1 and is electrically connected to second ground node of second circuit 124. Thus, diode 234 and diode 236 are electrically connected between conductive structure 246 (as the second ground reference rail 114) and conductive structure 244 (as a part of the common ground reference rail 116). Also, diode 234 and diode 236 are connected in parallel and have opposite polarities. Thus, in FIG. 2A, ESD conduction circuit 144 is implemented by two diodes that are both P-type diodes.

Integrated circuit 200A further includes a conductive structure 248 electrically connected to substrates 202-208 through corresponding heavily doped regions 202a, 204a, 206a, and 208a and corresponding well regions 202b, 204b, 206b, and 208b. Moreover, integrated circuit 200A includes pad structures 252, 254, 256, and 258 electrically connected to corresponding conductive structures 242, 244, 246, and 248. In some embodiments, conductive structures 244 and 248 are electrically connected (depicted by the dotted line 260), and conductive structure 248 thus is usable as another part of common ground reference rail 116 in FIG. 1. In some embodiments, the electrical connection 260 is implemented through an electrical path inside the integrated circuit 200A, such as through one or more of interconnection structures 212-218. In some embodiments, the electrical connection 260 is implemented through an electrical path outside the integrated circuit 200A, such as though an external conductive line connecting pad structures 254 and 258.

In some embodiments, each of conductive structures 242, 244, 246, and 248 includes a TSV, an ILV, a metal line, a via, a redistribution layer (RDL), a well structure, a polysilicon structure, or a combination thereof.

Figure 2B:
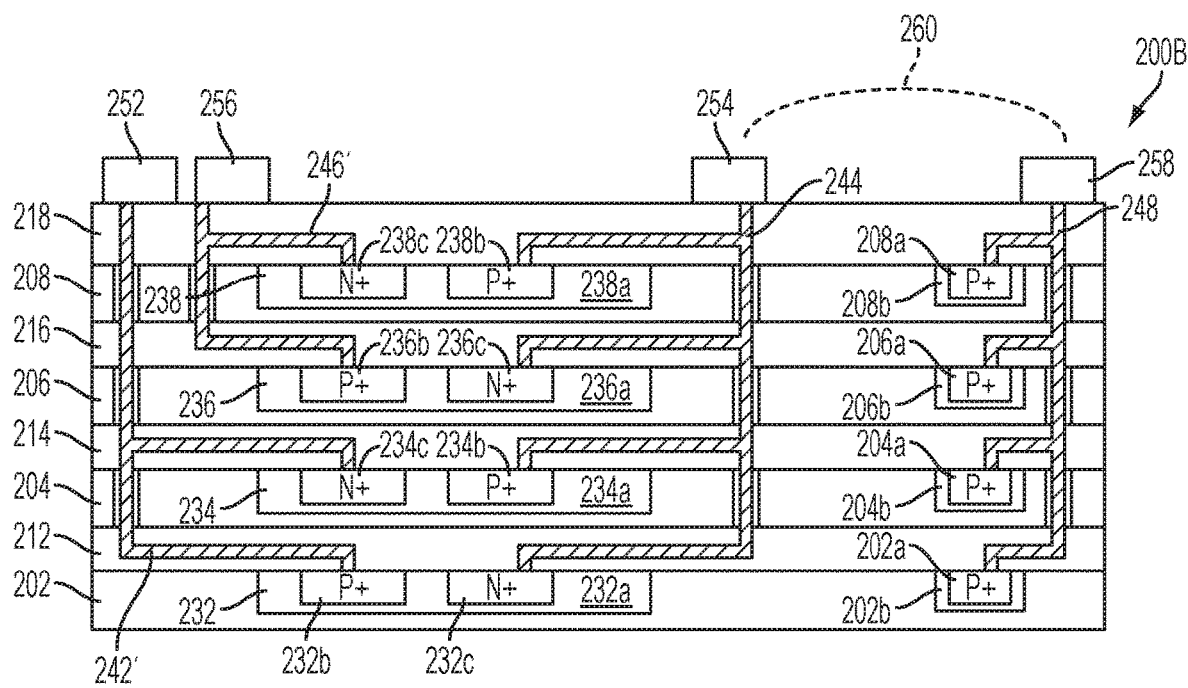

FIG. 2B is a cross-sectional view of a portion of another example integrated circuit 200B in accordance with one or more embodiments. Elements and features in FIG. 2B that are the same or similar to those in FIG. 2A are given the same reference numbers, and detailed description thereof is omitted.

Compared with integrated circuit 200A, integrated circuit 200B includes conductive structure 242' replacing conductive structure 242 and conductive structure 246' replacing conductive structure 246. In FIG. 2B, diode 232 and diode 234 are electrically connected between conductive structure 242' (as the first ground reference rail 112) and conductive structure 244 (as a part of the common ground reference rail 116). Diode 232 and diode 234 are connected in parallel and have opposite polarities. Also, diode 236 and diode 238 are electrically connected between conductive structure 246' (as the second ground reference rail 114) and conductive structure 244 (as a part of the common ground reference rail 116). Diode 236 and diode 238 are connected in parallel and have opposite polarities. Thus, in FIG. 2B, ESD conduction circuits 142 and 144 are each implemented by one P-type diode and one N-type diode.

Integrated circuit 200A and integrated circuit 200B are illustrated as non-limiting examples. Integrated circuit 200A and integrated circuit 200B are depicted as ILV-based 3D ICs. In some embodiments, integrated circuit 200A or integrated circuit 200B is a TSV-based 3D IC. In some embodiments, there are more or less than four substrates (and corresponding interconnections structures) in an integrated circuit. In some embodiments, the doping types of the substrates, the vertical order of various substrates, and the types and configurations of diodes are not limited to the examples depicted in FIG. 2A and FIG. 2B. Also, details of the interconnection structures 212-218 and the set of electrical components are simplified or omitted. Other suitable interconnection structures 212-218 and electrical components are within the scope of the present disclosure.

Figure 3A:
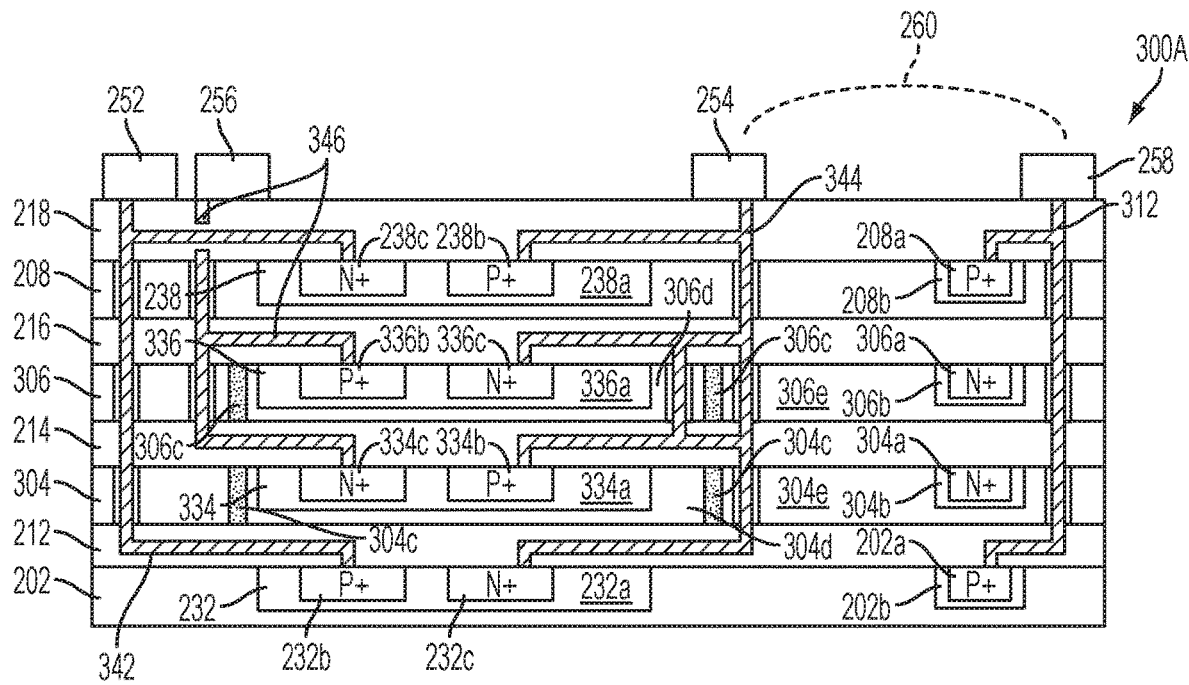
FIGS. 3A-3B are cross-sectional views of a portion of example integrated circuits in accordance with one or more embodiments.

FIG. 3A is a cross-sectional view of a portion of another example integrated circuit 300A in accordance with one or more embodiments. Elements and features in FIG. 3A that are the same or similar to those in FIG. 2A are given the same reference numbers, and detailed description thereof is omitted.

Compared with integrated circuit 200A, integrated circuit 300A has substrate 204 and substrate 206 replaced by substrate 304 and substrate 306. Substrates 304 and 306 have an N-type doping, and are referred to as N-type substrates in this disclosure. Each of the substrates 304 and 306 has a corresponding heavily doped N-type region 304a or 306a surrounded by a corresponding N-type well region 304b or 306b. Each of the substrates 304 and 306 is capable of being biased through corresponding region 304a or 306a and corresponding well region 304b or 306b.

Substrate 304 further includes an isolation structure 304c electrically separating substrate 304 into a first portion 304d surrounding by isolation structure 304c and a second portion 304e outside the isolation structure 304c. Substrate 306 further includes an isolation structure 306c electrically separating substrate 306 into a first portion 306d surrounding by isolation structure 306c and a second portion 306e outside the isolation structure 306c. In some embodiments, isolation structures 304c and 306c has a material including silicon oxide, or silicon nitride, or other suitable dielectric material.

Integrated circuit 300A further includes a conductive structure 312 that is electrically connected to pad structure 258 and functions as a part of common ground reference rail 116 in FIG. 1. Conductive structure 312 is electrically connected to substrates 202 and 204 through corresponding regions 202a or 208a and well regions 202b or 208a. In some embodiments, P-type transistors are formed on N-type substrates 204 or 206. In some embodiments, conductive structure 312, functioning as a part of the common ground reference rail of integrated circuit 300A, is electrically connected to a reference power source or ground, and source terminals of P-type transistors are electrically connected to a supply power source that has a voltage level greater than that of the reference power source or ground. Electrically connecting conductive structure 312 with N-type substrates 304 and 306 would cause the formation of leakage paths from power supply through P-type transistors to reference supply or ground, and thus is not preferable. Therefore, conductive structure 312 is free from being electrically connected to substrate 304 and substrate 306 through heavily doped regions 304a and 306a and corresponding well regions 304b and 306b.

Each of the substrates 304 and 306 has a corresponding diode 334 or 336 formed thereon. Diode 334 is formed on the portion 304d of substrate 304 and surrounded by isolation structure 304c. Diode 334 includes an N-type well 334a, a P-type anode region 334b, and an N-type cathode region 334c. Diode 334 is also referred to as a P-type diode, because diode 334 has a structure that the anode or P-type region is surrounded by the cathode or N-type region of the diode. Diode 336 is formed on the portion 306d of substrate 306 and surrounded by isolation structure 306c. Diode 336 includes an N-type well 336a, a P-type anode region 336b, and an N-type cathode region 336c, and is also a P-type diode.

In some embodiments, at least one of diodes 334 or 336 is a shallow trench isolation (STI) diode, a gated diode, a well diode, or a metal-oxide semiconductor (MOS) diode.

Anode 232b of diode 232 is electrically connected to cathode 238c of diode 238 through a conductive structure 342, which is in turn electrically connected to pad structure 252, and cathode 232c of diode 232 is electrically connected to anode 238b of diode 238 through a conductive structure 344, which is in turn electrically connected to pad structure 254. Conductive structure 342 is usable as first ground reference rail 112 in FIG. 1 and is electrically connected to first ground referenced node of first circuit 122. Conductive structure 344 is usable as a part of common ground reference rail 116 in FIG. 1. Thus, diode 232 and diode 238 are electrically connected between conductive structure 342 (as the first ground reference rail 112) and conductive structure 344 (as a part of the common ground reference rail 116). Also, diode 232 and diode 238 are connected in parallel and have opposite polarities. Thus, in FIG. 3A, ESD conduction circuit 142 is implemented by two diodes that are both P-type diodes.

Anode 334b of diode 334 is electrically connected to cathode 336c of diode 336 through conductive structure 344, and cathode 334c of diode 334 is electrically connected to anode 336b of diode 336 through a conductive structure 346, which is in turn electrically connected to pad structure 256. Conductive structure 346 is usable as second ground reference rail 114 in FIG. 1 and is electrically connected to second ground referenced node of first circuit 124. Thus, diode 334 and diode 336 are electrically connected between conductive structure 346 (as the second ground reference rail 114) and conductive structure 344 (as a part of the common ground reference rail 116). Also, diode 334 and diode 336 are connected in parallel and have opposite polarities. Thus, in FIG. 3A, ESD conduction circuit 144 is implemented by two diodes that are both P-type diodes.

Figure 3B:
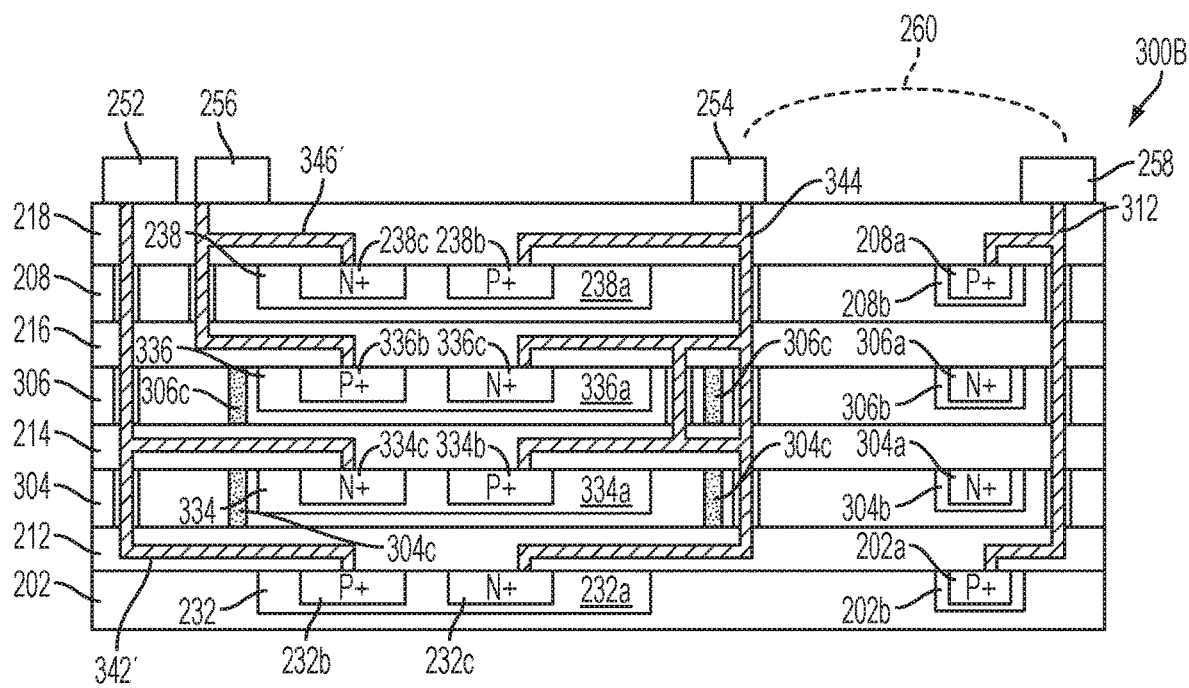

FIG. 3B is a cross-sectional view of a portion of another example integrated circuit 300B in accordance with one or more embodiments. Elements and features in FIG. 3B that are the same or similar to those in FIG. 2A and FIG. 3A are given the same reference numbers, and detailed description thereof is omitted.

Compared with integrated circuit 300A, integrated circuit 300B has conductive structure 342' replacing conductive structure 342 and conductive structure 346' replacing conductive structure 346. In FIG. 3B, diode 232 and diode 334 are electrically connected between conductive structure 342' (as the first ground reference rail 112) and conductive structure 344 (as a part of the common ground reference rail 116). Diode 232 and diode 334 are connected in parallel and have opposite polarities. Also, diode 336 and diode 238 are electrically connected between conductive structure 346' (as the second ground reference rail 114) and conductive structure 244 (as a part of the common ground reference rail 116). Diode 336 and diode 238 are connected in parallel and have opposite polarities. Thus, in FIG. 3B, ESD conduction circuits 142 and 144 are each implemented by one P-type diode and one N-type diode.

Integrated circuit 300A and integrated circuit 300B are illustrated as non-limiting examples. Integrated circuit 300A and integrated circuit 300B are depicted as ILV-based 3D ICs. In some embodiments, integrated circuit 300A or integrated circuit 300B is a TSV-based 3D IC. In some embodiments, there are more or less than four substrates (and corresponding interconnections structures) in an integrated circuit. In some embodiments, the doping types of the substrates, the vertical order of various substrates, and the types and configurations of diodes are not limited to the examples depicted in FIG. 3A and FIG. 3B.

Figure 4:
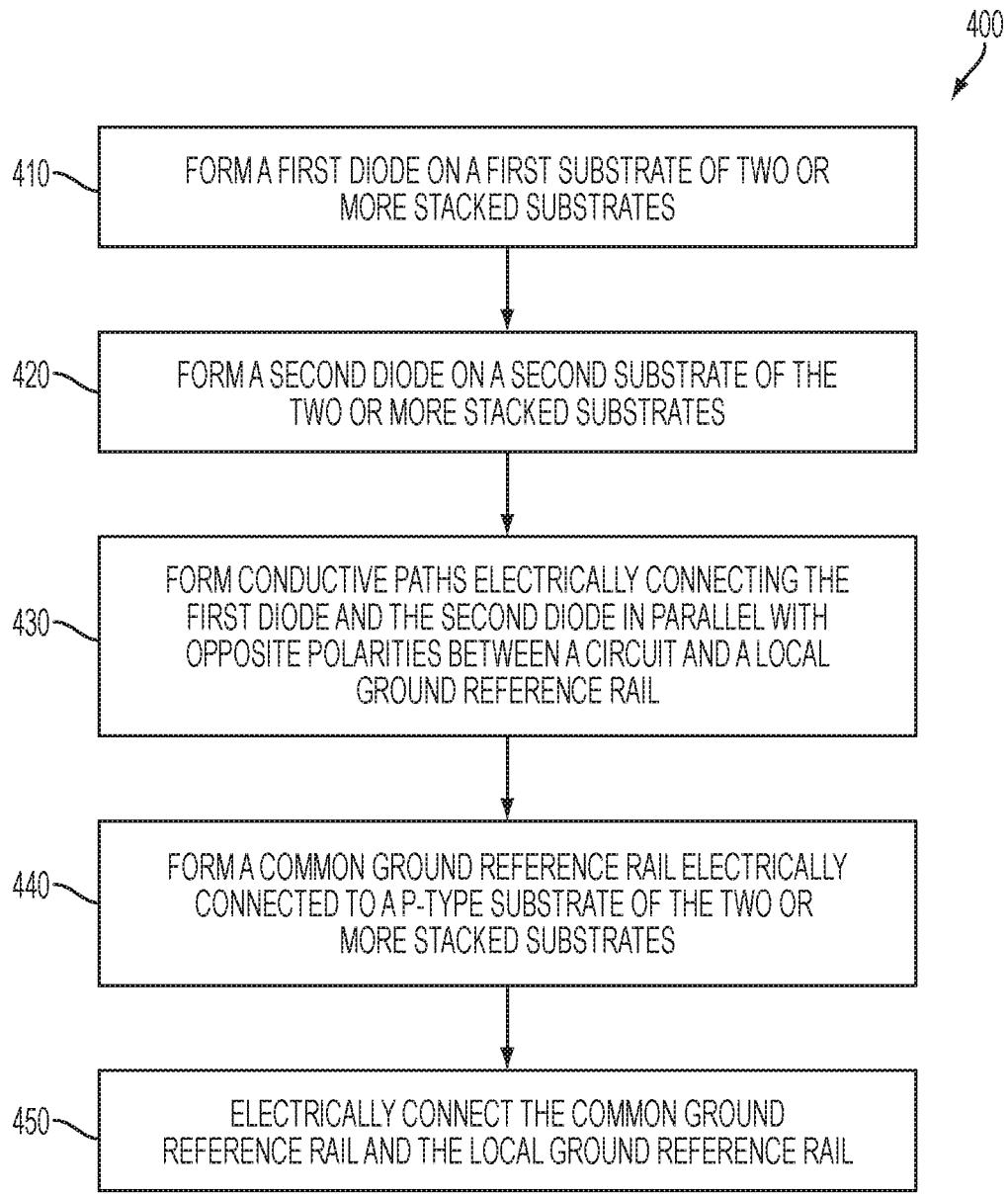
FIG. 4 is a flow chart of a method of manufacturing an integrated circuit in accordance with one or more embodiments.

FIG. 4 is a flow chart of a method 400 of manufacturing an integrated circuit, such as integrated circuit 200A, 200B, 300A, or 300B, in accordance with one or more embodiments. It is understood that additional operations may be performed before, during, and/or after the method 400 depicted in FIG. 4, and that some other processes may only be briefly described herein.

As depicted in FIG. 4 and FIG. 2A, method 400 begins with operation 410, where a first diode (such as diode 232) is formed on a substrate (such as substrate 232) of one or more stacked substrates. In operation 420, a second diode (such as diode 238) is formed on another substrate (such as substrate 238) of the one or more stacked substrates. In some embodiments, operations 410 and 420 are performed according to a suitable N-type MOS (NMOS) process, P-type MOS (PMOS) process, complementary MOS (CMOS) process, bipolar junction transistor (BJT) process, or other suitable process.

As depicted in FIG. 3A, if the first and second diodes are formed in N-type substrates (such as substrates 304 and 306), operation 410 further includes forming a first isolation structure (such as isolation structure 304c) surrounding the first diode (such as diode 334) in substrate 304. Also, operation 430 further includes forming a second isolation structure (such as isolation structure 306c) surrounding the second diode (such as diode 336) in substrate 306.

In operation 430, a conductive path (such as conductive structure 242) is formed to electrically connect an anode of the first diode and a cathode of the second diode. Also, in operation 430, another conductive path (such as conductive structure 244) is formed to electrically connect a cathode of the first diode and an anode of the second diode. In some embodiments, conductive structure 242 is electrically connected with an internal ground node of a first circuit 122, and conductive structure 244 functions as a local ground reference rail (such as ground reference rail 112).

In operation 440, a common ground rail (such as conductive structure 248) is formed to be electrically connected with one or more P-type substrates (such as substrate 202, 204, 206, and/or 208). As depicted in FIG. 4 and FIG. 3A, in some embodiments, the common ground rail is free from being electrically connected to N-type substrates (such as substrate 304 and 306).

In operation 450, the common ground rail and the local ground rail are electrically connected, either within the integrated circuit using the interconnection structures 212–218 or outside the integrated circuit through pad structures 254 and 258.

In an embodiment, a method (of forming an integrated circuit) includes: forming a first diode on a first substrate of two or more stacked substrates, the first substrate having a first predetermined doping type; forming a second diode on a second substrate of the two or more stacked substrates, the second substrate being formed on the first substrate, and the second substrate having the first predetermined doping type; and forming conductive paths electrically connecting the first diode and the second diode between a circuit and a first common ground rail, the first diode and the second diode being connected in parallel and having opposite polarities. In an embodiment, the two or more stacked substrates include a third substrate having a second predetermined doping type; the first predetermined doping type is an n-type doping and the second predetermined doping type is a p-type doping; and the method further includes: forming a second common ground rail electrically connected to the third substrate and free from being electrically connected to the first substrate and the second substrate. In an embodiment, the first predetermined doping type is a p-type doping and the second predetermined doping type is an n-type doping; and the method further includes forming a second common ground rail electrically connected to the first substrate and the second substrate. In an embodiment, the method further includes electrically connecting the first common ground rail and the second common ground rail. In an embodiment, the first predetermined doping type is an n-type doping; and the method further includes forming a first isolation structure in the first substrate, the first isolation structure surrounding the first diode, and forming a second isolation structure in the second substrate, the second isolation structure surrounding the second diode. In an embodiment, the forming conductive paths electrically connecting the first diode and the second diode between a circuit and a first common ground rail includes: forming a first intermediate ground rail; connecting the circuit to the first intermediate ground rail; and connecting the first diode and the second diode to the first intermediate ground rail. In an embodiment, the two or more stacked substrates include: a third substrate having a second predetermined doping type; and a fourth substrate formed on the second substrate, the fourth substrate having the second predetermined doping type; and the method further includes: forming a third diode on the third substrate; and forming a fourth diode on the fourth substrate. In an embodiment, the circuit to which the first diode and the second diode are connected is a first circuit; and the method further includes: forming conductive paths electrically connecting the third diode and the fourth diode between a second circuit and the first common ground rail, the third diode and the fourth diode being connected in parallel and having opposite polarities. In an embodiment, the forming conductive paths electrically connecting the third diode and the fourth diode between a second circuit and the first common ground rail includes: forming a second intermediate ground rail; connecting the second circuit to the second intermediate ground rail; and connecting the third diode and the fourth diode to the second intermediate ground rail.

In an embodiment, a method (of forming an integrated circuit) includes: forming a first diode on a first substrate of two or more stacked substrates, the first substrate having a first predetermined doping type; forming a second diode on a second substrate of the two or more stacked substrates, the second substrate being formed on the first substrate, and the second substrate having a second predetermined doping type; and forming conductive paths electrically connecting the first diode and the second diode between a circuit and a first common ground rail, the first diode and the second diode being connected in parallel and having opposite polarities. In an embodiment, the two or more stacked substrates include: a third substrate having the second predetermined doping type; the first predetermined doping type is a p-type doping and the second predetermined doping type is an n-type doping; and the method further includes forming a second common ground rail electrically connected to the first substrate and free from being electrically connected to the second substrate. In an embodiment, the method further includes: electrically connecting the first common ground rail and the second common ground rail. In an embodiment, the first predetermined doping type is an n-type doping and the second predetermined doping type is a p-type doping; and the method further includes forming a first isolation structure in the second substrate, the first isolation structure surrounding the second diode. In an embodiment, the forming conductive paths electrically connecting the first diode and the second diode between a circuit and a first common ground rail includes: forming a first intermediate ground rail; connecting the circuit to the first intermediate ground rail; and connecting the first diode and the second diode to the first intermediate ground rail. In an embodiment, the two or more stacked substrates include a third substrate formed on the second substrate, the third substrate having the second predetermined doping type, and a fourth substrate formed on the third substrate, the fourth substrate having the first predetermined doping type; and the method further includes: includes forming a third diode on the third substrate, and forming a fourth diode on the fourth substrate. In an embodiment, the circuit to which the first diode and the second diode are connected is a first circuit; and the method further includes forming conductive paths electrically connecting the third diode and the fourth diode between a second circuit and the first common ground rail, the third diode and the fourth diode being connected in parallel and having opposite polarities. In an embodiment, the forming conductive paths electrically connecting third diode and the fourth diode between a second circuit and the first common ground rail includes: forming a second intermediate ground rail; connecting the second circuit to the second intermediate ground rail; and connecting the third diode and the fourth diode to the second intermediate ground rail.

In an embodiment, a method (of forming an integrated circuit) includes: forming a first diode of a first conductivity type on a first substrate of two or more stacked substrates, the first substrate having a first predetermined doping type; forming a second diode of a second conductivity type on a second substrate of the two or more stacked substrates, the second conductivity type being different than the first conductivity type, the second substrate being formed on the first substrate, and the second substrate having the first predetermined doping type; and forming conductive paths electrically connecting the first diode and the second diode between a circuit and a first common ground rail, the first diode and the second diode being connected in parallel and having opposite polarities. In an embodiment, the two or more stacked substrates include a third substrate formed on the second substrate, the third substrate having the first predetermined doping type, and a fourth substrate formed on the third substrate, the fourth substrate having the first predetermined doping type; and the method further includes: forming a third diode of the second conductivity type on the third substrate; and forming a fourth diode of the first conductivity type on the fourth substrate. In an embodiment, the circuit to which the first diode and the second diode are connected is a first circuit; and the method further includes: forming conductive paths electrically connecting the third diode and the fourth diode between a second circuit and the first common ground rail, the third diode and the fourth diode being connected in parallel and having opposite polarities.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
    forming a first diode on a first substrate of two or more stacked substrates, the first substrate having a first predetermined doping type;
    forming a second diode on a second substrate of the two or more stacked substrates, the second substrate being formed over the first substrate, and the second substrate having the first predetermined doping type; and
    forming conductive paths electrically connecting the first diode and the second diode between a circuit and a first common ground rail, the first diode and the second diode being connected in parallel and having opposite polarities; and
    forming a second common ground rail electrically connected to the first substrate and the second substrate.

2. The method of claim 1, wherein:
    the first predetermined doping type is a P-type doping.

3. The method of claim 2, further comprising:
    electrically connecting the first common ground rail and the second common ground rail.

4. The method of claim 1, wherein:
    a second predetermined doping type is an N-type doping; and
    the method further comprises:
        forming a first isolation structure in a third substrate, the first isolation structure surrounding a third diode that is in the third substrate; and
        forming a second isolation structure in a fourth substrate, the second isolation structure surrounding a fourth diode that is in the fourth substrate.

5. The method of claim 1, wherein the forming conductive paths electrically connecting the first diode and the second diode between the circuit and the first common ground rail includes:
    forming a first intermediate ground rail;
    connecting the circuit to the first intermediate ground rail; and
    connecting the first diode and the second diode to the first intermediate ground rail.

6. The method of claim 1, wherein
    the two or more stacked substrates include:
        a third substrate having a second predetermined doping type; and
        a fourth substrate formed over the second substrate, the fourth substrate having the second predetermined doping type; and
    the method further comprises:
        forming a third diode on the third substrate; and forming a fourth diode on the fourth substrate.

7. The method of claim 6, wherein:
the circuit to which the first diode and the second diode are connected is a first circuit; and
the method further comprises:
forming conductive paths electrically connecting the third diode and the fourth diode between a second circuit and the first common ground rail, the third diode and the fourth diode being connected in parallel and having opposite polarities.

8. The method of claim 7, wherein the forming conductive paths electrically connecting the third diode and the fourth diode between the second circuit and the first common ground rail includes:
forming a first intermediate ground rail;
connecting the second circuit to the first intermediate ground rail; and
connecting the third diode and the fourth diode to the first intermediate ground rail.

9. A method of forming an integrated circuit, the method comprising:
forming a first diode on a first substrate of two or more stacked substrates, the first diode having a first predetermined conductivity type;
forming a second diode on a second substrate of the two or more stacked substrates, the second substrate being formed over the first substrate, and the second diode having the first predetermined conductivity type; and
forming conductive paths electrically connecting the first diode and the second diode between a circuit and a first common ground rail, the first diode and the second diode being connected in parallel and having opposite polarities; and
forming a second common ground rail electrically connected to the first substrate and the second substrate.

10. The method of claim 9, further comprising:
electrically connecting the first common ground rail and the second common ground rail; and
wherein the first predetermined conductivity type is a P-type.

11. The method of claim 9, wherein:
the method further comprises:
forming a first isolation structure in a third substrate, the first isolation structure surrounding a third diode.

12. The method of claim 9, wherein the forming conductive paths electrically connecting the first diode and the second diode between the circuit and the first common ground rail includes:
forming a first intermediate ground rail;
connecting the circuit and to the first intermediate ground rail; and
connecting the first diode and the second diode to the first intermediate ground rail.

13. The method of claim 9, wherein the two or more stacked substrates include:
a third substrate formed over the second substrate, the third substrate having a second predetermined doping type; and
a fourth substrate formed below the first substrate, the fourth substrate having the second predetermined doping type; and
the method further comprises:
forming a third diode on the third substrate; and
forming a fourth diode on the fourth substrate.

14. The method of claim 13, wherein:
the circuit to which the first diode and the second diode are connected is a first circuit; and
the method further comprises:
forming conductive paths electrically connecting the third diode and the fourth diode between a second circuit and the first common ground rail, the third diode and the fourth diode being connected in parallel and having opposite polarities.

15. The method of claim 6, wherein:
the third substrate is located on the first substrate;
the fourth substrate is located on the third substrate; and
the second substrate is located on the fourth substrate.

16. A method of forming an integrated circuit, the method comprising:
forming a stack of first, second, third and fourth substrates having a same predetermined doping type;
forming a first diode on the first substrate, the first diode having a first predetermined conductivity type;
forming a second diode on the fourth substrate, the second diode having the first predetermined conductivity type;
forming a third diode on the second substrate, the third diode having a second predetermined conductivity type;
forming a fourth diode on the third substrate, the fourth diode having the second predetermined conductivity type; and
forming conductive paths electrically connecting a first pair of the first, second, third and fourth diodes between a circuit and a first common ground rail, the first pair being connected in parallel and having opposite polarities; and
forming a second common ground rail electrically connected to a first pair of the first, second, third and fourth substrates.

17. The method of claim 16, wherein:
the first pair of the first, second, third and fourth diodes includes the first diode and the second diode.

18. The method of claim 17, wherein:
the method further comprises:
forming conductive paths electrically connecting a second pair including the third and fourth diodes between a second circuit and the first common ground rail, the second pair being connected in parallel and having opposite polarities.

19. The method of claim 1, wherein:
portions of the conductive paths are embedded in interconnect structures formed correspondingly over the two or more stacked substrates.

20. The method of claim 9, wherein:
portions of the conductive paths are embedded in interconnect structures formed correspondingly over the two or more stacked substrates.

* * * * *